United States Patent [19]

Luo

[11] 4,115,799
[45] Sep. 19, 1978

[54] THIN FILM COPPER TRANSITION BETWEEN ALUMINUM AND INDIUM COPPER FILMS

[75] Inventor: Fang-Chen Luo, Wilkins Township, Allegheny County, Pa.

[73] Assignee: Westinghouse Electric Corp., Pittsburgh, Pa.

[21] Appl. No.: 762,546

[22] Filed: Jan. 26, 1977

[51] Int. Cl.² ............... H01L 29/46; H01L 29/54
[52] U.S. Cl. ................................... 357/71; 357/4; 357/23; 357/45; 357/67
[58] Field of Search .............. 357/4, 23, 71, 45, 65, 357/67

[56] References Cited

U.S. PATENT DOCUMENTS

| | | | |
|---|---|---|---|
| 3,483,038 | 12/1969 | Hui et al. | 357/71 |
| 3,737,340 | 6/1973 | Maeda et al. | 357/71 |
| 4,000,842 | 1/1977 | Burns | 357/71 |
| 4,040,073 | 8/1977 | Luo | 357/4 |
| 4,065,781 | 12/1977 | Gutknecht | 357/4 |

*Primary Examiner*—Joseph E. Clawson, Jr.
*Attorney, Agent, or Firm*—W. G. Sutcliff

[57] ABSTRACT

A stable, low resistance electrical connection is made between thin film aluminum areas and thin film indium-copper conductive areas of an electronic circuit layout. The transition is made by deposition of a thin copper film as a transition region to connect the aluminum and indium-copper areas.

5 Claims, 2 Drawing Figures

THIN FILM COPPER TRANSITION BETWEEN ALUMINUM AND INDIUM COPPER FILMS

BACKGROUND OF THE INVENTION

The present invention relates to thin film electronic circuit components, and more particularly to providing low resistance, electrical contacts between dissimilar conductive films. It has been the practice to utilize thin films of aluminum as the primary conductive interconnect areas or bus bars between thin film transistors and associated thin film circuitry. It is possible to fabricate large area flat panel matrix display devices in which X-Y aluminum bus bars electrically interconnect thin film transistor circuit arrays which are disposed at individual display points defined between the intersecting bus bars. Aluminum is particularly effective as the bus bar conductor material because it is particularly easy to provide an aluminum oxide insulating layer between overlapping intersecting bus bars, which must be electrically isolated from each other. This well-insulated overlapping relationship of the aluminum bus bars is essential to eliminate any possibility of cross-talk between display elements and for a proper addressing sequence.

A particularly effective thin film transistor is disclosed in U.S. Pat. No. 4,040,073 owned by the assignee of the present invention, in which the source and drain contacts of the thin film transistor are fabricated of indium-copper. In fabricating a thin film transistor matrix array utilizing such thin film transistors with indium-copper source and drain contacts, literally thousands of connections must be made from such contacts to the X-Y aluminum bus bar films. It is also common practice to utilize an aluminum film as capacitor electrodes in such circuitry, and it is necessary to interconnect such capacitor electrodes to the indium-copper contacts of the transistors. A basic problem arises due to the incompatibility of aluminum and the indium-copper contacts. When aluminum overlaps the indium-copper, an unreliable joint or connection is produced during high temperature annealing of the thin film transistor, which is carried out at about 350° C. A resistive junction or connection results due to diffusion and alloying of the indium with aluminum. This junction is characterized by structural irregularity and upon annealing at high temperature by failure of continuity.

SUMMARY OF THE INVENTION

A stable, low resistance electrical connection is made between aluminum thin film areas and indium-copper conductive areas by providing a thin film copper transition area which overlaps and contacts the respective aluminum and indium-copper contacts. The copper makes a stable low resistance junction with both the aluminum and the indium-copper contacts.

DESCRIPTION OF THE PREFERRED EMBODIMENTS

Figure 1:
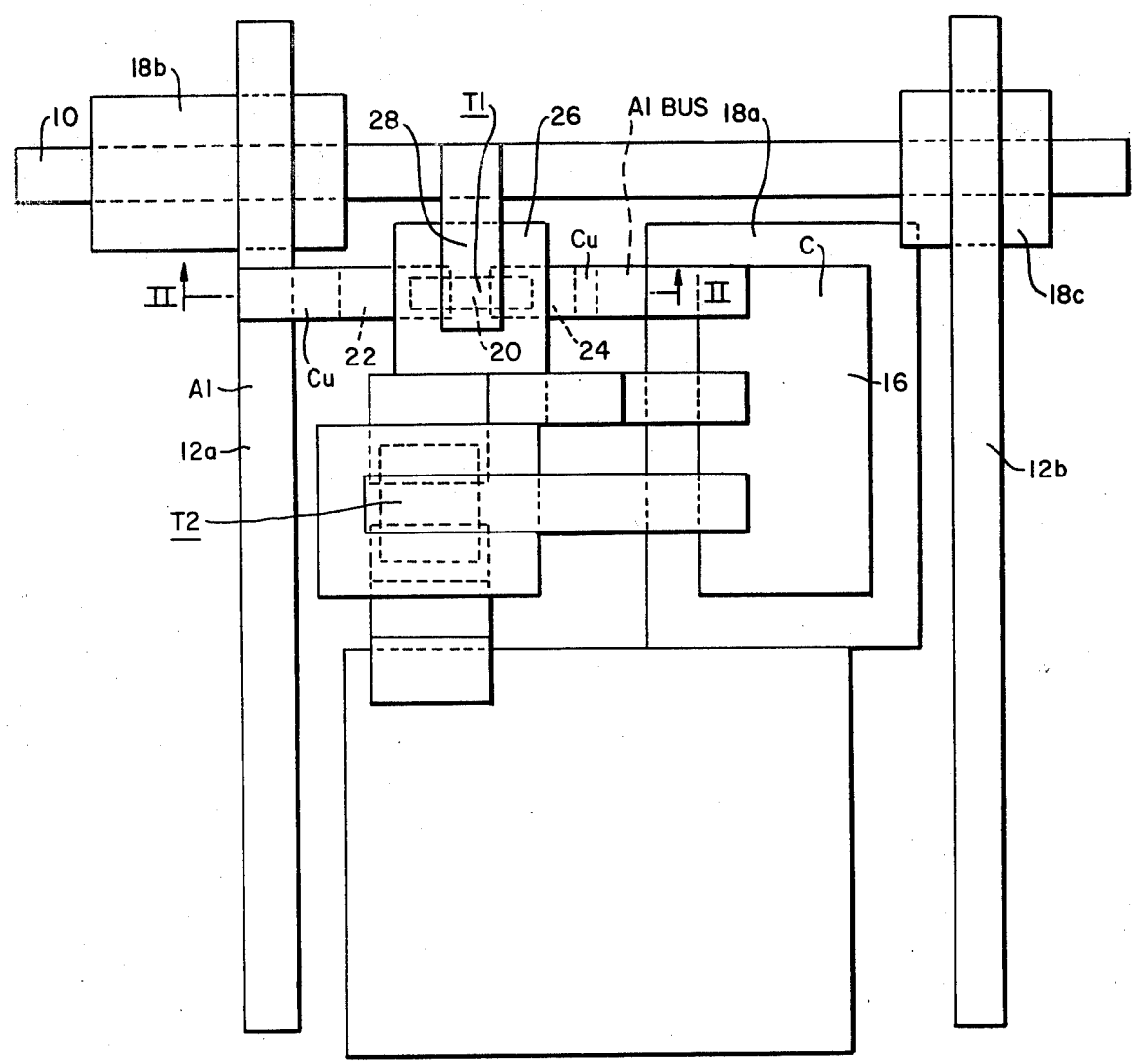
FIG. 1 is a plan view of a circuit layout of a thin film transistor circuit as is typically used in a thin film display panel.
Figure 2:
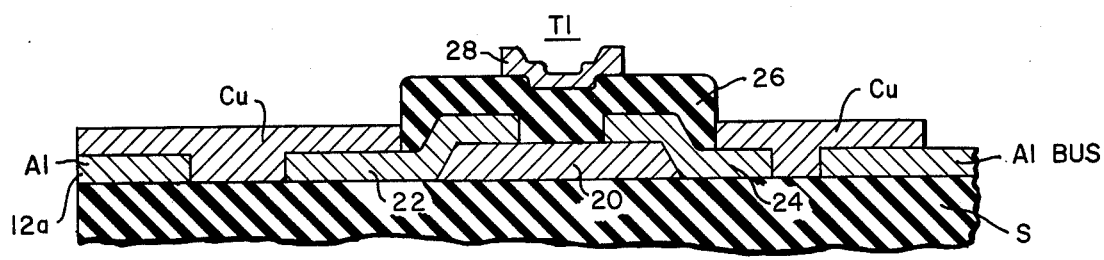
FIG. 2 is a cross-sectional view taken through a single thin film transistor element of the circuit seen in FIG. 1.

A partially fabricated small area of a thin film transistor controlled matrix display array is seen in FIG. 1, and a cross-section of one of the transistors and its contact connections is seen in FIG. 2.

The circuit layout of FIG. 1 is repeated across the area of an insulative substrate S of a display panel which typically utilizes electroluminescent phosphor as the display medium. Such thin film transistor circuitry is fabricated by sequentially vacuum depositing selected materials through aperture masks to establish and build the basic thin film pattern.

The vertical thin film aluminum bus 10 and the horizontal aluminum buses 12a and 12b extend to the substrate periphery while interconnecting rows and columns of such repeated circuits. The peripheral ends of such buses are connected to addressing and drive circuitry.

The basic circuitry connected between bus bars 10, 12a, 12b may include a first thin film transistor T1, a second thin film transistor T2, and a signal storage capacitor C. A display medium modulating electrode area 14 formed of an aluminum film is interconnected to transistor T2 as will be explained. The storage capacitor C may be three-conductive level device with insulating layers 18a of aluminum oxide between the conductive levels of aluminum. The conductive levels or areas 16 are approximately equal in area, and the bottom and top conductive levels are joined together at their periphery and are connected to the drain contact of transistor T1 via a copper transition area, and also connected to the aluminum gate of transistor T2. The middle conductive area of capacitor C is sandwiched between the top and bottom areas and insulated therefrom by aluminum oxide insulative pads 18a. This middle conductive layer functions as the other side of the capacitor C and is connected to the indium-copper drain contact of transistor T2 via copper transistion area. Aluminum oxide insulating pads are deposited between all conductive areas which are to be electrically isolated such as insulating pads 18b, 18c between bus bar cross-over points.

The transistors T1 and T2 each are formed of a semiconductive channel area 20 which is typically cadmium selenide. Spaced apart source and drain contacts 22 and 24 formed of indium-copper thin films overlap and electrically contact the edge around the semiconductive channel 20 as seen more clearly in FIG. 2. An insulating pad or area 26 of aluminum oxide is provided atop the source and drain contacts 22 and 24 and over the semiconductive channel 20. A conductive gate 28 of aluminum is disposed atop the insulating pad 26 over the semiconductive channel 20 between the source and drain contacts for controlling the conductance of the device.

In all areas of the circuit where the indium-copper source and drain contacts are electrically connected to the various aluminum film areas a thin film of copper is deposited in overlapping relationship between the indium-copper contact and the aluminum area. Such copper transitions are necessary between the transistor source and drain contacts to the respective aluminum bus bars and to the capacitor C and electrode 14.

By way of example, indium-copper source and drain contacts are typically formed by first depositing about 100 Angstroms of indium partially overlapping the cadmium selenide film. Then about 1000 Angstroms of copper is deposited atop the indium. After completion of the fabrication it is conventional to anneal such devices by heating to about 350° C. in a nitrogen atmosphere and some of the indium is thought to alloy or dope the copper.

The aluminum conductive films which form the buses and the capacitor plates and display electrode are all typically about 1000 Angstroms thick. The copper film transition areas between the indium-copper contacts and these aluminum areas is preferably about 1000 Angstroms thick to form a stable, low resistance electrical connection. Such copper film transitions are structurally smooth and permit reliable long-lived electrical interconnection. This is particularly important for a large area display panel in which thousands of such interconnected circuits comprise display points which must all work to provide a usable display.

I claim:

1. In a thin film transistor matrix array in which X-Y aluminum buses electrically interconnect thin film transistor circuit arrays in which the source and drain contacts of the thin film transistors comprise a layer of indium contacting the semiconductive material and a layer of copper atop the indium forming indium-copper source and drain contacts the improvement comprising thin film copper transition areas between the aluminum buses and the indium-copper source and drain contacts.

2. The thin film transistor matrix array as set forth in claim 1, wherein the thin film transistor circuit arrays include enlarged aluminum pads to serve as one of capacitor electrodes and display element modulation electrodes, with the thin film copper transition areas provided between such enlarged aluminum pads and the indium-copper source and drain contacts of the transistors.

3. The thin film transistor matrix array as set forth in claim 1, wherein thin film copper transition areas are about 1000 Angstroms thick.

4. In a thin film electrical device in which a plurality of spaced apart orthogonal thin film aluminum bus bars are disposed upon a substrate in insulating overlapped relationship to define an X-Y matrix array, and wherein thin film transistor circuit arrays are disposed upon the substrate between and interconnected to adjacent bus bars, wherein the source and drain conductive contacts of the thin film transistors comprise a copper-indium film, the improvement wherein thin film copper transition areas are disposed between and in overlapping relationship with the aluminum buses and the copper-indium source and drain contacts.

5. In a thin film electrical device comprising a thin film transistor disposed upon a substrate with interconnecting aluminum bus leads which permit connection of the transistor to other circuit elements and wherein the source and drain contacts of the thin film transistor comprise indium doped copper film, the improvement comprising disposing thin film copper transition areas between the aluminum buses and the indium-copper contacts.

* * * * *